United States Patent
Wu et al.

(10) Patent No.: US 11,139,678 B1
(45) Date of Patent: Oct. 5, 2021

(54) POWER SUPPLY SYSTEM WITH AUTOMATIC TRANSFER SWITCHES

(71) Applicant: DELTA ELECTRONICS, INC., Taoyuan (TW)

(72) Inventors: Chih-Ming Wu, Taoyuan (TW); Chi-Ming Mai, Taoyuan (TW); Yu-Ruei Zeng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/884,605

(22) Filed: May 27, 2020

(30) Foreign Application Priority Data

Mar. 30, 2020 (CN) .......................... 202010234596.7

(51) Int. Cl.
*H02J 1/10* (2006.01)
*H02J 9/04* (2006.01)
*H02J 9/06* (2006.01)
*H03K 17/687* (2006.01)
*H03K 17/60* (2006.01)

(52) U.S. Cl.
CPC .................. *H02J 9/04* (2013.01); *H02J 1/10* (2013.01); *H02J 9/061* (2013.01); *H02J 9/062* (2013.01); *H02J 9/068* (2020.01); *H03K 17/60* (2013.01); *H03K 17/687* (2013.01)

(58) Field of Classification Search
CPC ...... H02J 9/061; H02J 1/10; H02J 9/04; H02J 9/062; H02J 9/068; H03K 17/687; H03K 17/60
See application file for complete search history.

(56) References Cited

U.S. PATENT DOCUMENTS

| 2013/0099566 A1* | 4/2013 | Pfitzer | H02J 3/14 307/29 |
| 2013/0106190 A1* | 5/2013 | Lin | H02J 9/061 307/64 |
| 2013/0235492 A1* | 9/2013 | Zhou | H01H 9/542 361/18 |
| 2017/0040999 A1* | 2/2017 | Schneider | H02J 3/005 |
| 2017/0359061 A1* | 12/2017 | Tsai | H03K 17/122 |

* cited by examiner

*Primary Examiner* — Hal Kaplan
*Assistant Examiner* — Rasem Mourad
(74) *Attorney, Agent, or Firm* — Muncy, Geissler, Olds & Lowe, P.C.

(57) ABSTRACT

A power supply system for automatic transfer switch applications comprises two first switch apparatuses, two second switch apparatuses, and a control unit. Each first switch apparatus comprises a first relay switch and a first switch assembly. The first switch assembly comprises a first bypass switch, a first semi-controllable switch, and a first fully-controllable switch. Each second switch apparatus comprises a second relay switch and a second switch assembly. The second switch assembly comprises a second bypass switch, a second semi-controllable switch, and a second fully-controllable switch. The control unit controls the two first switch apparatuses and the two switch apparatuses to uninterruptedly supply power to a load.

10 Claims, 5 Drawing Sheets

POWER SUPPLY SYSTEM WITH AUTOMATIC TRANSFER SWITCHES

BACKGROUND

Technical Field

The present disclosure relates to a power supply system, and more particularly to a power supply system with automatic transfer switches.

Description of Related Art

Automatic transfer switch (ATS) is a power circuit switch, which is used to switch power supply circuits between a main power source and a backup power source so as to uninterruptedly supply power to a load. When the main power source is insufficient, interrupted or abnormal, the automatic transfer switch will automatically switch the power supply circuit to the backup power source, so that the backup power source can alternatively continue to provide stable power to the load, which ensures the equipment of the load being able to continue to operate and avoid further risks of property or human damage and financial losses caused by the power failure condition.

Figure 1:
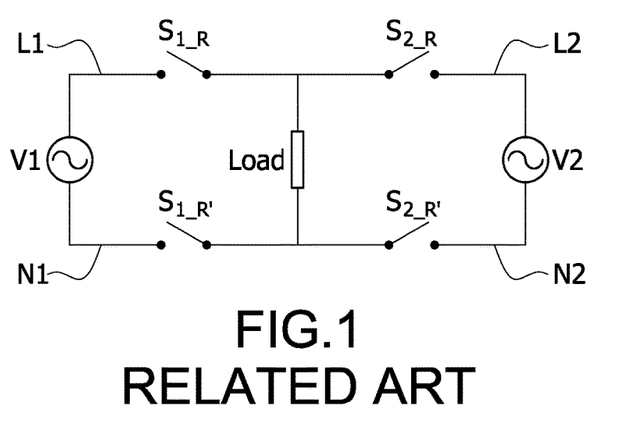
FIG. 1 is a schematic circuit diagram of a power supply system using relays as automatic transfer switches in the related art.

Please refer to FIG. 1. The power supply system has a dual power source circuit structure, and the two power sources V1 and V2 are switched alternatively through a plurality of relays $S_{1\_R}, S_{1\_R}', S_{2\_R}, S_{2\_R}'$ to provide uninterrupted normal power to a load Load.

When the main power source V1 normally supplies power, the relay $S_{1\_R}$ at a first point (for example, but not limited to a Live point L1) and the relay $S_{1\_R}'$ at a second point (for example, but not limited to a Neutral point N1) of the main power source V1 are turned on so that the load Load is powered by the main power source V1. On the contrary, if the main power source V1 fails, the relay $S_{1\_R}$ and the relay $S_{1\_R}'$ will be turned off, and simultaneously the relay $S_{2\_R}$ at a first point L2 and the relay $S_{2\_R}'$ at a second point N2 of the backup power source V2 will be turned on. Accordingly, the load Load can continuously be powered by the backup power source V2 when the main power source V1 fails, reducing the risks of damages or losses.

However, during the process of switching the power sources, some issues may occur due to the mechanical characteristics of the relay, such as slow switching time and unable to withstand instantaneous large currents (poor reliability at high currents). Therefore, in some practical applications, a semi-controllable switch is further used, such as but not limited to, a silicon controlled rectifier (SCR).

Figure 2:
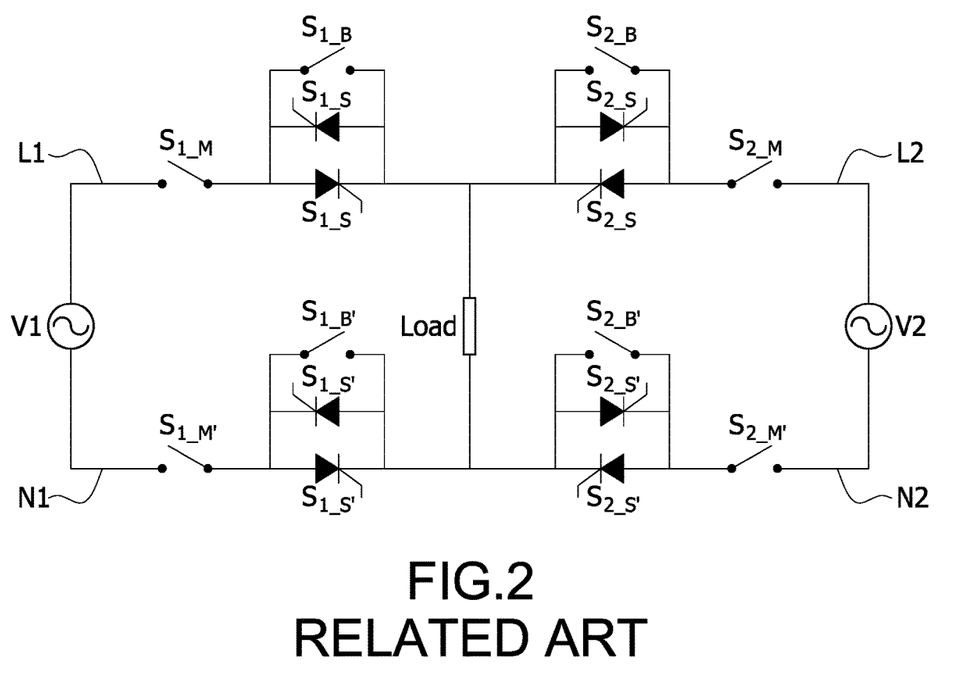
FIG. 2 is a schematic circuit diagram of the power supply system using relays and SCRs as automatic transfer switches in the related art.
Figure 3:
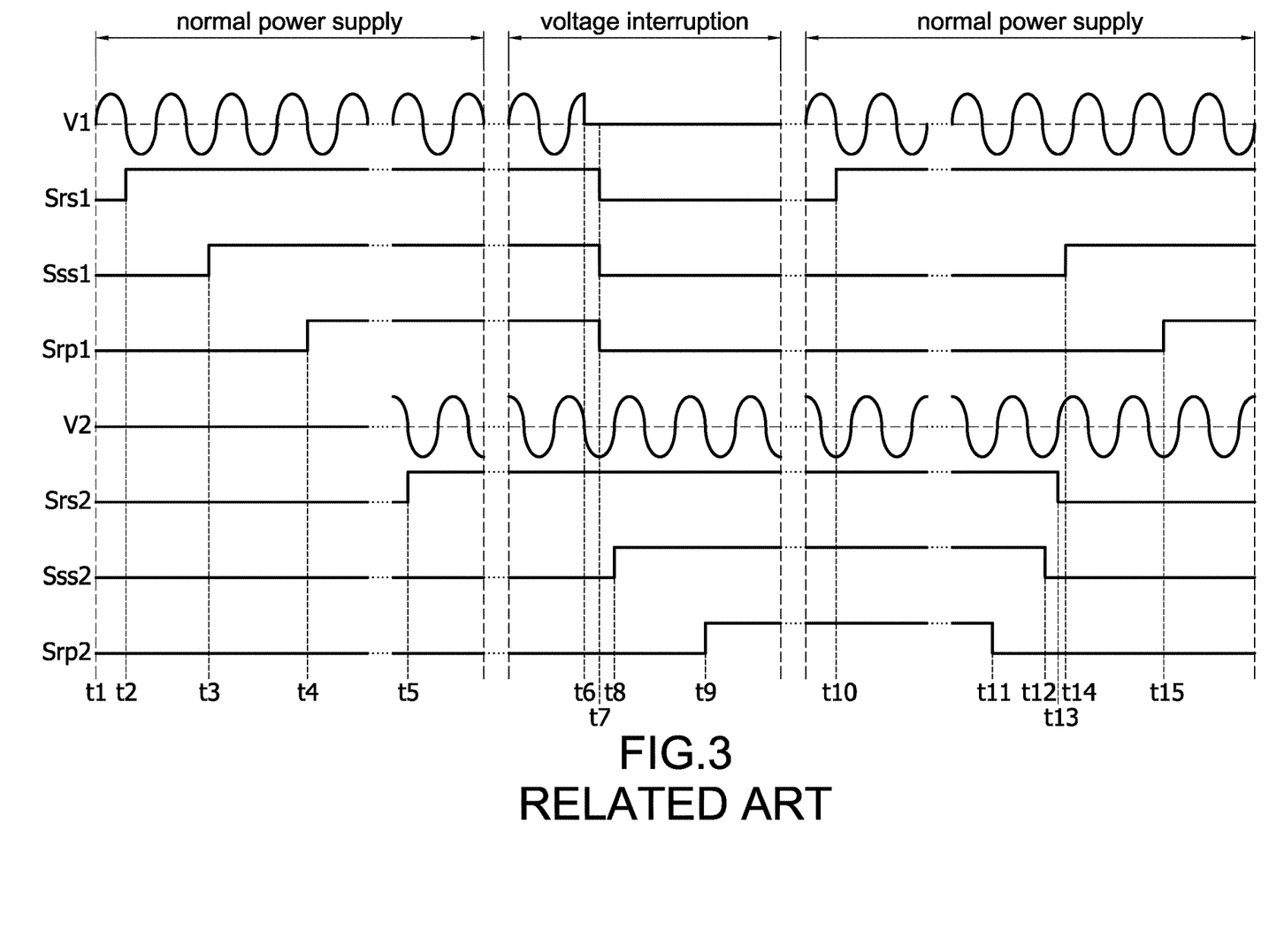
FIG. 3 is a schematic timing diagram of the power supply system with automatic transfer switches operating while a main power source is interrupted and then returns to normal in the related art.

Please refer to FIG. 2. Since the SCR has the ability to withstand instantaneous large currents, and does not have a mechanical life limit as the relay, it can avoid some issues while using relay switches, for example, the contacts of the relay switches may be damaged by electric arc generated when the relay switches are switched at instantaneous large currents. Furthermore, after switching for many times, the relay switches may fail to open or close, which may cause switching failures or mismatches of switching sequence between the main power source V1 and the backup power source V2. For specific system operation timing of the power supply system using SCR as ATS, see FIG. 3. However, such technology of automatic transfer switches is not only limited to the application of voltage interruption, but also can be applied to any abnormality or failure of the main power source, such as voltage sags or surges.

However, in the process of disconnecting the power source of the circuit in FIG. 2, due to the characteristic of the SCR that it cannot be turned off by external control signals, the circuit still needs to be cut off by the relay switches. Therefore, the switching issues may still occur because of the above-mentioned characteristics of the relay switches, such as slow switching time and poor reliability at large currents.

SUMMARY

An object of the present disclosure is to provide a power supply system with automatic transfer switches to solve the above-mentioned problems.

The power supply system with automatic transfer switches includes two first switch apparatuses, two second switch apparatuses, and a control unit. The two first switch apparatuses are respectively coupled to a first point and a second point of a first power source. Each first switch apparatus includes a first relay switch and a first switch assembly. The first relay switch is electrically coupled to the first power source. The first switch assembly is electrically coupled between the first relay switch and a load. The first switch assembly includes a first bypass switch, a first semi-controllable switch, and a first fully-controllable switch. The first semi-controllable switch is coupled in parallel to the first bypass switch. The first fully-controllable switch is coupled in parallel to the first semi-controllable switch. The two second switch apparatuses are respectively coupled to a first point and a second point of a second power source. Each second switch apparatus includes a second relay switch and a second switch assembly. The second relay switch is electrically coupled to the second power source. The second switch assembly is electrically coupled between the second relay switch and the load. The second switch assembly includes a second bypass switch, a second semi-controllable switch, and a second fully-controllable switch. The second semi-controllable switch is coupled in parallel to the second bypass switch. The second fully-controllable switch is coupled in parallel to the second semi-controllable switch. The control unit controls the first switch apparatuses and the second switch apparatuses so that the load can be powered by the first power source or the second power source.

Another object of the present disclosure is to provide a power supply system with automatic transfer switches to solve the above-mentioned problems.

The power supply system with automatic transfer switches includes a first switch apparatus, a second switch apparatus, and a control unit. The first switch apparatus includes a first relay switch and a first switch assembly. The first relay switch is electrically coupled to a first power source. The first switch assembly is electrically coupled between the first relay switch and a load. The first switch assembly includes a first bypass switch, a first semi-controllable switch, and a first fully-controllable switch. The first semi-controllable switch is coupled in parallel to the first bypass switch. The first fully-controllable switch is coupled in parallel to the first semi-controllable switch. The second switch apparatus includes a second relay switch and a second switch assembly. The second relay switch is electrically coupled to a second power source. The second switch assembly is electrically coupled between the second relay switch and the load. The second switch assembly includes a second bypass switch, a second semi-controllable switch, and a second fully-controllable switch. The second semi-controllable switch is coupled in parallel to the second bypass switch. The second fully-controllable switch is coupled in parallel to the second semi-controllable switch. The control unit controls the first switch apparatus and the second switch apparatus so that the load can be powered by the first power source or the second power source.

Further another object of the present disclosure is to provide a method of controlling a power supply system with automatic transfer switches to solve the above-mentioned problems.

The method of controlling the power supply system with automatic transfer switches to uninterruptedly supply power to a load. The power supply system with automatic transfer switches includes a first switch apparatus coupled to a first power source and a second switch apparatus coupled to a second power source. The first switch apparatus includes a first relay switch and a first switch assembly having a first bypass switch, a first semi-controllable switch, and a first fully-controllable switch. The second switch apparatus includes a second relay switch and a second switch assembly having a second bypass switch, a second semi-controllable switch, and a second fully-controllable switch. The method includes steps of: first turning on the first relay switch, and then turning on the first bypass switch and turning on the first semi-controllable switch and the first fully-controllable switch when the first power source is normal so that the load is powered by the first power source; turning on the second relay switch when the second power source is normal; first turning off the first bypass switch, and then turning off the first relay switch, and then turning off the first fully-controllable switch when the first power source is abnormal so that the first power source stop supplying power to the load, and then turning on the second bypass switch, and turning on the second semi-controllable switch and the second fully-controllable switch so that the load is powered by the second power source.

More specifically, the power supply system with automatic transfer switches and the method of controlling the same are provided to use fully-controllable semiconductor switches such as IGBTs or MOSFETs that have the ability to be turned off when large currents flow through, further having shorter switching time and being on/off controllable to achieve more accurate switching control, thereby increasing power supply quality and reliability.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 4:
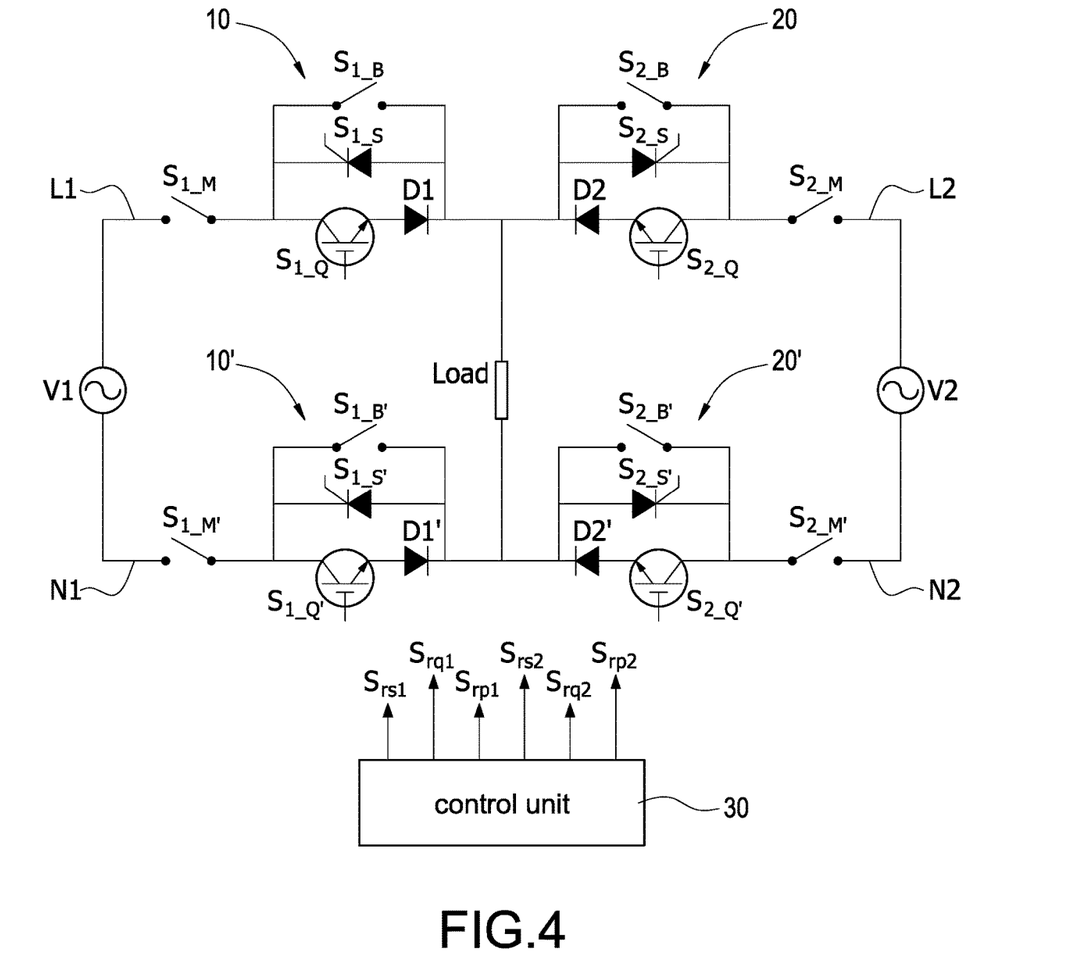
FIG. 4 is a schematic circuit diagram of a power supply system with automatic transfer switches according to the present disclosure.

Please refer to FIG. 4. The power supply system with automatic transfer switches of the present disclosure is used to uninterruptedly supply power to a load. The power supply system with automatic transfer switches includes two first switch apparatuses 10,10', two second switch apparatuses 20,20', and a control unit 30. The two first switch apparatuses 10,10' are respectively coupled to a first point and a second point of a first power source V1, for example, a main power source V1, and will be presented in terms of "main power source switch apparatus" in the following contents. The two second switch apparatuses 20,20' are respectively coupled to a first point and a second point of a second power source V2, for example, a backup power source V2, and will be presented in terms of "backup power source switch apparatus" in the following contents. When the main power source V1 and the backup power source V2 are single-phase AC power sources, the first point of the main power source V1 is a live point of the main power source V1 and the second point of the main power source V1 is a neutral point of the main power source V1. The first point of the backup power source V2 is a live point of the backup power source V2 and the second point of the backup power source V2 is a neutral point of the backup power source V2.

When the main power source V1 and the backup power source V2 are three-phase AC power sources with delta configuration (Δ configuration), the first point and the second point of the main power source V1 are any two live points of the main power source V1, and the first point and the second point of the backup power source V2 are any two live points of the backup power source V2. When the main power source V1 and the backup power source V2 are three-phase AC power sources with star configuration (Y configuration), the first point of the main power source V1 is a live point of the main power source V1 and the second point of the main power source V1 is a neutral point of the main power source V1, and the first point of the backup power source V2 is a live point of the backup power source V2 and the second point of the backup power source V2 is a neutral point of the backup power source V2. For convenience, take the main power source V1 and the backup power source V2 as single-phase AC power sources for example in the following contents.

The main power source switch apparatus 10 includes a first relay switch $S_{1\_M}$ and a first switch assembly. The first relay switch $S_{1\_M}$ is electrically coupled to the live point L1 of the main power source V1. The first switch assembly is electrically coupled between the first relay switch $S_{1\_M}$ and a load Load. The first switch assembly includes a first bypass switch $S_{1\_B}$, a first semi-controllable switch $S_{1\_S}$, and a first fully-controllable switch $S_{1\_Q}$. The first semi-controllable switch $S_{1\_S}$ is coupled in parallel to the first bypass switch $S_{1\_B}$. The first fully-controllable switch $S_{1\_Q}$ is coupled in parallel to the first semi-controllable switch $S_{1\_S}$. The first switch assembly further includes a first diode D1, and the first diode D1 is coupled in series to the first fully-controllable switch $S_{1\_Q}$ and is used to protect the first fully-controllable switch S More specifically, the first diode D1 is used to prevent a reverse current from flowing through the first fully-controllable switch $S_{1\_Q}$, which may cause damage to the first fully-controllable switch $S_{1\_Q}$.

The main power source switch apparatus 10' includes a first relay switch $S_{1\_M}'$ and a first switch assembly. The first relay switch $S_{1\_M}'$ is electrically coupled to the neutral point N1 of the main power source V1. The first switch assembly is electrically coupled between the first relay switch $S_{1\_M}'$ and the load Load. The first switch assembly includes a first bypass switch $S_{1\_B}'$, a first semi-controllable switch and a first fully-controllable switch S The first semi-controllable switch $S_{1\_S}'$ is coupled in parallel to the first bypass switch $S_{1\_B}'$. The first fully-controllable switch $S_{1\_Q}'$ is coupled in parallel to the first semi-controllable switch $S_{1\_S}'$. The first switch assembly further includes a first diode D1', and the first diode D1' is coupled in series to the first fully-controllable switch $S_{1\_Q}'$ and is used to protect the first fully-controllable switch $S_{1\_Q}'$. More specifically, the first diode D1' is used to prevent a reverse current from flowing through the first fully-controllable switch $S_{1\_Q}'$, which may cause damage to the first fully-controllable switch $S_{1\_Q}'$.

The backup power source switch apparatus 20 includes a second relay switch $S_{2\_M}$ and a second switch assembly. The second relay switch $S_{2\_M}$ is electrically coupled to the live point L2 of the backup power source V2. The second switch assembly is electrically coupled between the second relay switch $S_{2\_M}$ and the load Load. The second switch assembly includes a second bypass switch $S_{2\_B}$, a second semi-controllable switch $S_{2\_S}$, and a second fully-controllable switch $S_{2\_Q}$. The second semi-controllable switch $S_{2\_S}$ is coupled in parallel to the second bypass switch $S_{2\_B}$. The second fully-controllable switch $S_{2\_Q}$ is coupled in parallel to the second semi-controllable switch $S_{2\_S}$. The second switch assembly further includes a second diode D2, and the second diode D2 is coupled in series to the second fully-controllable switch $S_{2\_Q}$ and is used to protect the second fully-controllable switch $S_{2\_Q}$. More specifically, the second diode D2 is used to prevent a reverse current from flowing through the second fully-controllable switch $S_{2\_Q}$, which may cause damage to the second fully-controllable switch $S_{2\_Q}$.

The backup power source switch apparatus 20' includes a second relay switch $S_{2\_M}'$ and a second switch assembly. The second relay switch $S_{2\_M}'$ is electrically coupled to the neutral point N2 of the backup power source V2. The second switch assembly is electrically coupled between the second relay switch $S_{2\_M}'$ and the load Load. The second switch assembly includes a second bypass switch $S_{2\_B}'$, a second semi-controllable switch $S_{2\_S}'$, and a second fully-controllable switch $S_{2\_Q}'$. The second semi-controllable switch $S_{2\_S}'$ is coupled in parallel to the second bypass switch $S_{2\_B}'$. The second fully-controllable switch $S_{2\_Q}'$ is coupled in parallel to the second semi-controllable switch $S_{2\_S}'$. The second switch assembly further includes a second diode D2', and the second diode D2' is coupled in series to the second fully-controllable switch $S_{2\_Q}'$ and is used to protect the second fully-controllable switch $S_{2\_Q}$. More specifically, the second diode D2' is used to prevent a reverse current from flowing through the second fully-controllable switch $S_{2\_Q}$, which may cause damage to the second fully-controllable switch $S_{2\_Q}$.

In one embodiment, the first bypass switches $S_{1\_B}$, $S_{1\_B}'$ and the second bypass switches $S_{2\_B}$, $S_{2\_B}'$ are relay switches. The first semi-controllable switches $S_{1\_S}$, $S_{1\_S}'$ and the second semi-controllable switches $S_{2\_S}$, $S_{2\_S}'$ are silicon-controlled rectifier (SCR) switches. The first fully-controllable switches $S_{1\_Q}$, $S_{1\_Q}'$ and the second fully-controllable switches $S_{2\_Q}$, $S_{2\_Q}'$ are insulated gate bipolar transistor (IGBT) switches or metal-oxide-semiconductor field-effect transistor (MOSFET) switches. However, the present disclosure is not limited to the above-mentioned types of switches.

The control unit 30 controls the main power source switch apparatuses 10,10' and the backup power source switch apparatuses 20,20' so that the load Load is powered by the main power source V1 or the backup power source V2. The control unit 30 is electrically coupled to the main power source switch apparatuses 10,10' and the backup power source switch apparatuses 20,20' and generates a plurality of control signals Srs1,Srq1,Srp1,Srs2,Srq2,Srp2 to respectively control the first relay switches $S_{1\_M}, S_{1\_M}'$, the first bypass switches $S_{1\_B}, S_{1\_B}'$, the first semi-controllable switches $S_{1\_S}, S_{1\_S}'$, the first fully-controllable switches $S_{1\_Q}, S_{1\_Q}'$, the second relay switches $S_{2\_M}, S_{2\_M}'$, the second bypass switches $S_{2\_B}, S_{2\_B}'$, the second semi-controllable switches $S_{2\_S}, S_{2\_S}'$, and the second fully-controllable switches $S_{2\_Q}, S_{2\_Q}'$.

Figure 5:
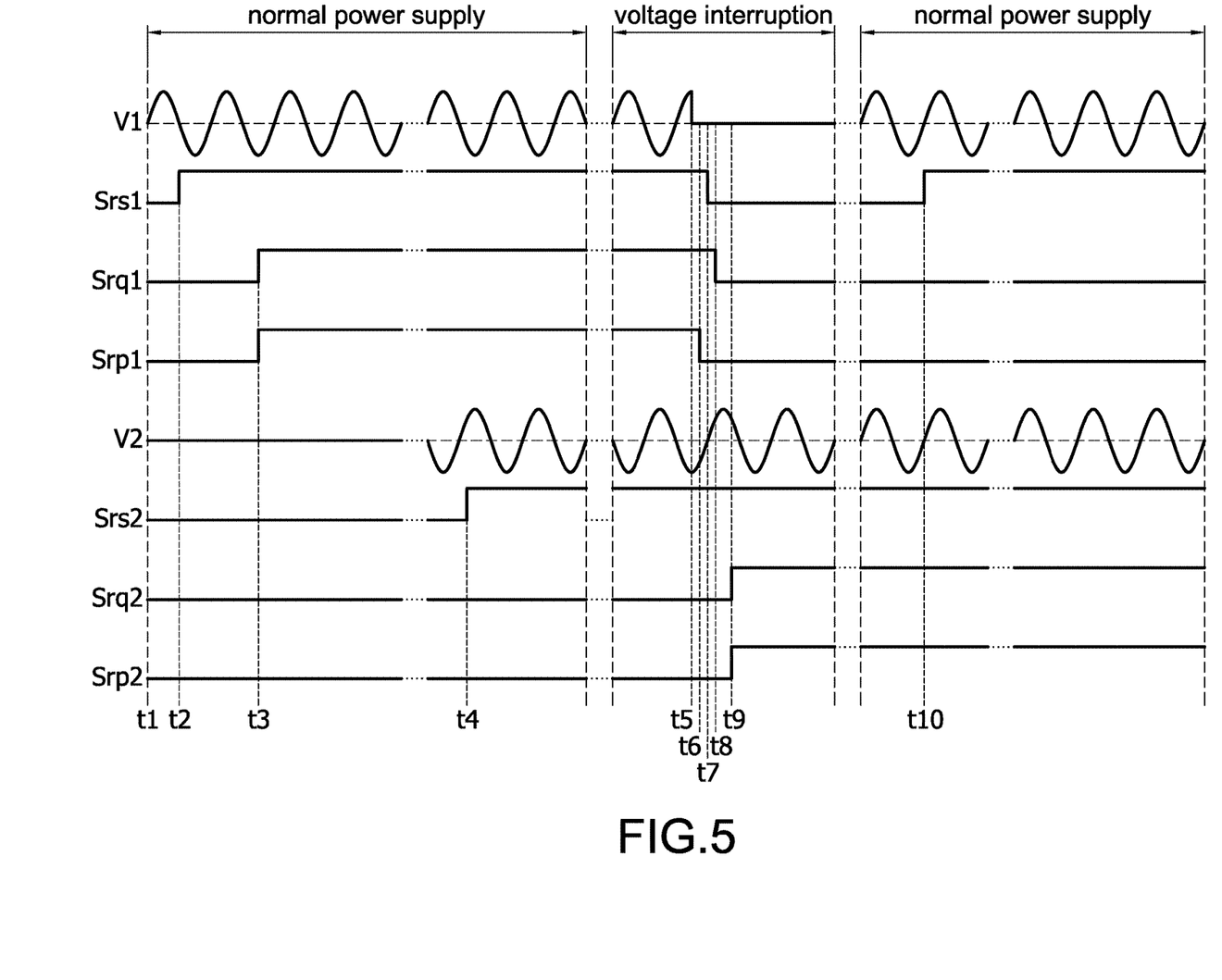
FIG. 5 is a schematic timing diagram of the power supply system with automatic transfer switches operating while a main power source is interrupted and then returns to normal according to the present disclosure.

Please refer to FIG. 5, indicating a control signal timing diagram of a power transition process of the power supply system with automatic transfer switches when a main power source V1 happens to be interrupted and then returns to normal according to the present invention, wherein the power transition process is divided into three periods. In the first period of the power transition process, at a time point t1, the main power source V1 is normal, while the backup power source V2 is not ready yet. At a time point t2, the control unit 30 provides a first relay control signal Srs1 with a high level to turn on the first relay switches $S_{1\_M}, S_{1\_M}'$. Afterward, at a time point t3, the control unit 30 provides a first bypass relay control signal Srp1 with a high level to turn on the first bypass switches $S_{1\_B}, S_{1\_B}'$, and simultaneously provides a first power switch control signal Srq1 with a high level to turn on the first semi-controllable switches $S_{1\_S}$, $S_{1\_S}'$ and the first fully-controllable switches $S_{1\_Q}, S_{1\_Q}'$. It's worth mentioning that since the first bypass switches $S_{1\_B}, S_{1\_B}'$ are mechanical relays with slower switching time, the first bypass switches $S_{1\_B}, S_{1\_B}'$ will be actually turned on later than the first semi-controllable switches $S_{1\_S}, S_{1\_S}'$ and the first fully-controllable switches $S_{1\_Q}, S_{1\_Q}'$. Therefore, this can avoid the damage to the relay switch contacts caused by instantaneous high currents flowing through the relay switches (the first bypass switches $S_{1\_B}, S_{1\_B}'$) while the relay switches are switching, which may also cause the relay switches to fail to open or close. Accordingly, the normal main power source V1 can supply the required power to the load Load.

In order to enable the backup power source V2 to supply power as soon as the main power source V1 is abnormal so as to ensure the power supply quality and reliability, once the backup power source V2 is ready to supply power, at a time point t4 the control unit 30 provides a second relay control signal Srs2 with a high level to turn on the second relay switches $S_{2\_M}, S_{2\_M}'$. In this condition, since the second bypass switches $S_{2\_B}, S_{2\_B}'$, the second semi-controllable switches $S_{2\_S}, S_{2\_S}'$, and the second fully-controllable switches $S_{2\_Q}, S_{2\_Q}'$ are not turned on, the backup power source V2 is just in a ready state without actually supplying power.

In the second period of the power transition process, at a time point t5, a voltage interruption of the main power source V1 occurs and is detected. In order to uninterruptedly supply power to the load Load, the main power source V1 should be removed and then the backup power source V2 which has been in the ready state should be further introduced. At a time point t6, the control unit 30 provides the first bypass relay control signal Srp1 with a low level to turn off the first bypass switches $S_{1\_B}, S_{1\_B}'$. Afterward, at a time point t7, the control unit 30 provides the first relay control signal Srs1 with a low level to turn off the first relay switches Afterward, at a time point t8, the control unit 30 provides the first power switch control signal Srq1 with a low level to turn off the first fully-controllable switches $S_{1\_Q}, S_{1\_Q}'$. It's worth mentioning that since the first relay switches $S_{1\_M}$, $S_{1\_M}'$ and the first bypass switches $S_{1\_B}, S_{1\_B}'$ are mechanical relays, the actual turned-off sequence of the switches should be: the first bypass switches $S_{1\_B}, S_{1\_B}'$ are first turned off so that the current flowing through the first switch assembly will be changed to flow through the first fully-controllable switches $S_{1\_Q}, S_{1\_Q}'$. Afterward, the first fully-controllable switches $S_{1\_Q}, S_{1\_Q}'$ are turned off so that the circuit between the main power source V1 and the load Load is disconnected. Finally, the first relay switches $S_{1\_M}, S_{1\_M}'$ are turned off. Accordingly, the abnormal main power source V1 can be successfully removed by turning off the first relay switches $S_{1\_M}, S_{1\_M}'$, the first bypass switches $S_{1\_B}, S_{1\_B}'$, and the first fully-controllable switches $S_{1\_Q}, S_{1\_Q}'$.

When the main power source V1 is successfully removed (and the backup power source V2 has been ready for power supply), the control unit 30 provides a second bypass relay control signal Srp2 with a high level to turn on the second bypass switches $S_{2\_B}, S_{2\_B}'$, and simultaneously provides a second power switch control signal Srq2 with a high level to turn on the second semi-controllable switches $S_{2\_S}, S_{2\_S}'$ and the second fully-controllable switches $S_{2\_Q}, S_{2\_Q}'$ at a time point t9. Since the second bypass switches $S_{2\_B}, S_{2\_B}'$ are mechanical relays, the second bypass switches $S_{2\_B}, S_{2\_B}'$ will be turned on later than the second semi-controllable switches $S_{2\_S}, S_{2\_S}'$ and the second fully-controllable switches $S_{2\_Q}, S_{2\_Q}'$. Therefore, this can avoid damage to the relay switch contacts caused by instantaneous high currents flowing through the relay switches (the second bypass switches $S_{2\_B}, S_{2\_B}'$) while the relay switches are switching, which may cause the relay switches to fail to open or close. Accordingly, the backup power source V2 in the ready state replaces the main power source V1 to uninterruptedly supply power to the load Load.

In the third period of the power transition process, once the main power source V1 returns to normal and is able to normally supply power, at a time point t10 the control unit 30 first turns on the first relay switches That is, before the first bypass switches $S_{1\_B}, S_{1\_B}'$, the first semi-controllable switches $S_{1\_S}, S_{1\_S}'$, and the first fully-controllable switches $S_{1\_Q}, S_{1\_Q}'$ are not turned on, the first relay switches $S_{1\_M}$, $S_{1\_M}'$ will be turned on first so that the main power source V1 may be ready for power supply after it returns to normal. Similarly, the main power source V1 successfully replaces the backup power source V2 to re-dominate the power supply for the load Load by turning off the second bypass switches $S_{2\_B}, S_{2\_B}$ and the second fully-controllable switches $S_{2\_Q}, S_{2\_Q}'$, and turning on the first bypass switches $S_{1\_B}, S_{1\_B}'$, the first semi-controllable switches and the first fully-controllable switches $S_{1\_Q}, S_{1\_Q}'$.

Figure 6:
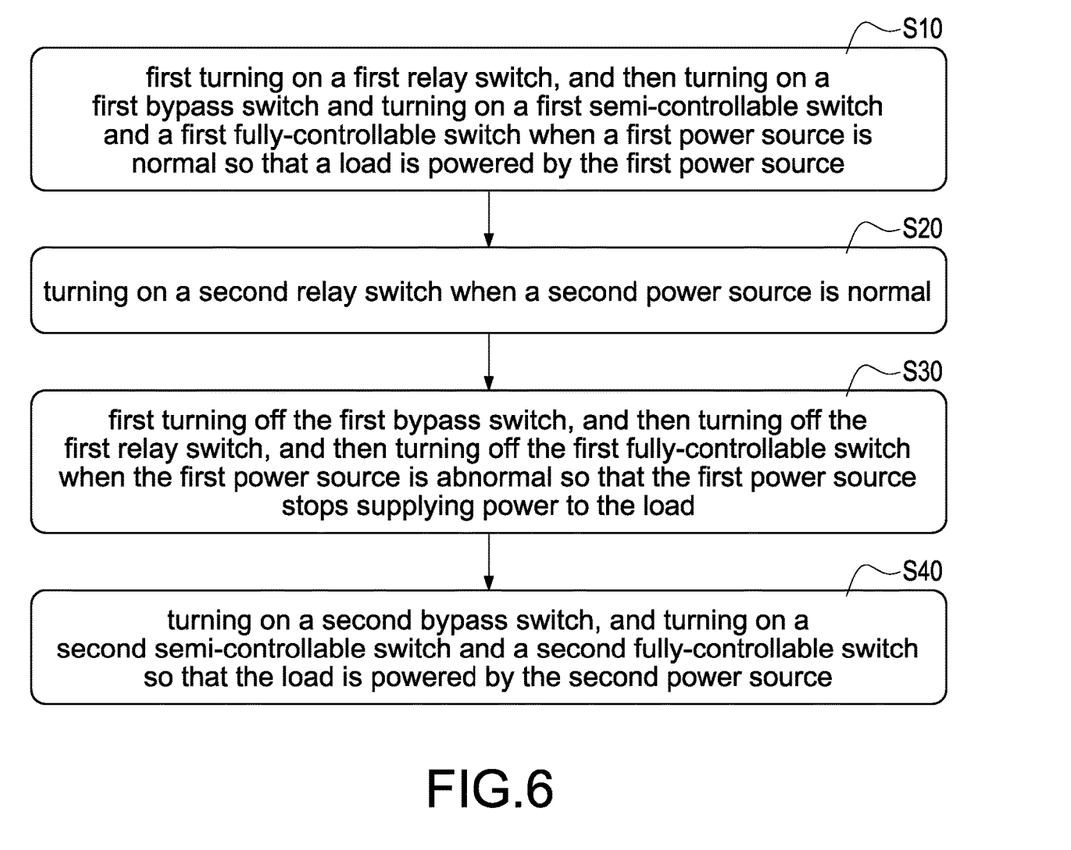
FIG. 6 is a flowchart of a method of controlling the power supply system with automatic transfer switches according to the present disclosure.

Please refer to FIG. 6, indicating a method of controlling the power supply system with automatic transfer switches, including following steps:

(S10) first turning on the first relay switch, and then turning on the first bypass switch and turning on the first semi-controllable switch and the first fully-controllable switch when a main power source is normal so that the load is powered by the main power source;

(S20) turning on the second relay switch when a backup power source is normal;

(S30) first turning off the first bypass switch, and then turning off the first relay switch, and then turning off the first fully-controllable switch when the main power source is abnormal so that the main power source stop supplying power to the load; and (S40) turning on the second bypass switch, and turning on the second semi-controllable switch and the second fully-controllable switch so that the load is powered by the backup power source.

In conclusion, the present disclosure has following features and advantages:

1. Silicon controlled rectifier (SCR) has the ability to withstand instantaneous large currents, which can replace mechanical relays with limited operating life, and it also can avoid the issue that the relay switch contacts may be damaged by the electric arc generated when the relay switches are switched at instantaneous large currents. Also, after switching for many times, the relay switches may fail to open or close, which may cause switching failures or mismatches of switching sequence between the main power source V1 and the backup power source V2.

2. Insulated gate bipolar transistor (IGBT) or metal-oxide-semiconductor field-effect transistor (MOSFET) has the ability to be turned off when a large current flows through, that is, a better ability to cut off large currents, and further has shorter switching time and is ON/OFF controllable to achieve more accurate switching control, thereby increasing power supply quality and power supply reliability.

What is claimed is:

1. A power supply system, comprising:
two first switch apparatuses respectively coupled to a first point and a second point of a first power source, each first switch apparatus comprising:
a first relay switch electrically coupled to the first power source, and
a first switch assembly electrically coupled between the first relay switch and a load, the first switch assembly comprising:
a first bypass switch,
a first semi-controllable switch coupled in parallel to the first bypass switch,
and
a first fully-controllable switch coupled in parallel to the first semi-controllable switch,
two second switch apparatuses respectively coupled to a first point and a second point of a second power source, each second switch apparatus comprising:
a second relay switch electrically coupled to the second power source, and
a second switch assembly electrically coupled between the second relay switch and the load, the second switch assembly comprising:
a second bypass switch,
a second semi-controllable switch coupled in parallel to the second bypass switch, and
a second fully-controllable switch coupled in parallel to the second semi-controllable switch, and
a control unit configured to control the first switch apparatuses and the second switch apparatuses so that the load can be powered by the first power source or the second power source, wherein the first fully-controllable switch is controlled by the control unit to be turned on for a current of the first power source to flow through the first fully-controllable switch to the load and to be turned off to interrupt the current of the first power source, and the second fully-controllable switch is controlled by the control unit to be turned on for a current of the second power source to flow through the second fully-controllable switch to the load and to be turned off to interrupt the current of the second power source, wherein the first fully-controllable switch and the first semi-controllable switch are simultaneously controlled to be turned on and off.

2. The power supply system in claim 1, wherein the first switch assembly further comprises a first diode, and the first diode is coupled in series to the first fully-controllable switch to prevent a reverse current flowing through the first fully-controllable switch; the second switch assembly further comprises a second diode, and the second diode is coupled in series to the second fully-controllable switch to prevent a reverse current flowing through the second fully-controllable switch.

3. The power supply system in claim 1, wherein when the first power source and the second power source are single-phase AC power sources, the first point of the first power source is a Live point of the first power source, and the second point of the first power source is a Neutral point of the first power source; the first point of the second power source is a Live point of the second power source and the second point of the second power source is a Neutral point of the second power source.

4. The power supply system in claim 1, wherein the first bypass switch and the second bypass switch are relay switches; the first semi-controllable switch and the second semi-controllable switch are silicon controlled rectifier switches; the first fully-controllable switch and the second fully-controllable switch are insulated gate bipolar transistor switches or metal-oxide-semiconductor field-effect transistor switches.

5. A power supply system, comprising:
a first switch apparatus comprising:
a first relay switch electrically coupled to a first power source, and
a first switch assembly electrically coupled between the first relay switch and a load, the first switch assembly comprising:
a first bypass switch,
a first semi-controllable switch coupled in parallel to the first bypass switch, and
a first fully-controllable switch coupled in parallel to the first semi-controllable switch,
a second switch apparatus comprising:
a second relay switch electrically coupled to a second power source, and
a second switch assembly electrically coupled between the second relay switch and the load, the second switch assembly comprising:
a second bypass switch,
a second semi-controllable switch coupled in parallel to the second bypass switch, and
a second fully-controllable switch coupled in parallel to the second semi-controllable switch, and
a control unit configured to control the first switch apparatus and the second switch apparatus so that the load can be powered by the first power source or the second power source,
wherein the first fully-controllable switch is controlled by the control unit to be turned on for a current of the first power source to flow through the first fully-controllable switch to the load and to be turned off to interrupt the current of the first power source, and the second fully-controllable switch is controlled by the control unit to be turned on for a current of the second power source to flow through the second fully-controllable switch to the load and to be turned off to interrupt the current of the second power source, wherein the first fully-controllable switch and the first semi-controllable switch are simultaneously controlled to be turned on and off.

6. The power supply system in claim 5, wherein the first switch assembly further comprises a first diode, and the first diode is coupled in series to the first fully-controllable switch to prevent a reverse current flowing through the first fully-controllable switch; the second switch assembly further comprises a second diode, and the second diode is coupled in series to the second fully-controllable switch to prevent a reverse current flowing through the second fully-controllable switch.

7. The power supply system in claim 6, wherein the first bypass switch and the second bypass switch are relay switches; the first semi-controllable switch and the second semi-controllable switch are silicon controlled rectifier switches; the first fully-controllable switch and the second fully-controllable switch are insulated gate bipolar transistor switches or metal-oxide-semiconductor field-effect transistor switches.

8. A method of controlling a power supply system to uninterruptedly supply power to a load; the power supply system comprises a first switch apparatus coupled to a first power source, and a second switch apparatus coupled to a second power source; the first switch apparatus comprises a first relay switch and a first switch assembly having a first bypass switch, a first semi-controllable switch, and a first fully-controllable switch; the second switch apparatus comprises a second relay switch and a second switch assembly having a second bypass switch, a second semi-controllable switch, and a second fully-controllable switch; the method comprises steps of:
first turning on the first relay switch, and then turning on the first bypass switch and turning on the first semi-controllable switch and the first fully-controllable switch when the first power source is normal so that the load is powered by the first power source,
turning on the second relay switch when the second power source is normal,
first turning off the first bypass switch, and then turning off the first relay switch, and then turning off the first fully-controllable switch when the first power source is abnormal so that the first power source stops supplying power to the load, and
turning on the second bypass switch, and turning on the second semi-controllable switch and the second fully-controllable switch so that the load is powered by the second power source.

9. The method of controlling the power supply system in claim 8, wherein the first switch assembly further comprises a first diode, and the first diode is coupled in series to the first fully-controllable switch to prevent a reverse current flowing through the first fully-controllable switch; the second switch assembly further comprises a second diode, and the second diode is coupled in series to the second fully-controllable switch to prevent a reverse current flowing through the second fully-controllable switch.

10. The method of controlling the power supply system in claim 8, wherein the first bypass switch and the second bypass switch are relay switches; the first semi-controllable switch and the second semi-controllable switch are silicon controlled rectifier switches; the first fully-controllable switch and the second fully-controllable switch are insulated gate bipolar transistor switches or metal-oxide-semiconductor field-effect transistor switches.

\* \* \* \* \*